United States Patent [19]

Solanki et al.

[11] Patent Number: 5,553,376

[45] Date of Patent: Sep. 10, 1996

[54] METHOD OF AND APPARATUS FOR CHANGING A PRODUCTION SETUP

[75] Inventors: Ranvir S. Solanki, Cary; Eric J. Gasmann, Round Lake Beach; Joseph R. Kane, Lake Zurich, all of Ill.; Edward P. Griffin, Lacey's Spring; Andrew M. Gantt, Huntsville, both of Ala.

[73] Assignee: Motorola, Inc., Schaumburg, Ill.

[21] Appl. No.: 388,775

[22] Filed: Feb. 15, 1995

[51] Int. Cl.⁶ .............................. B23P 19/04; H05K 3/30
[52] U.S. Cl. .................. 29/833; 29/709; 29/721; 29/740
[58] Field of Search .................... 29/709, 720, 721, 29/740, 833, 834, 836

[56] References Cited

U.S. PATENT DOCUMENTS

| | | | |
|---|---|---|---|
| 4,889,229 | 12/1989 | Yamamoto et al. | 29/740 X |
| 5,283,943 | 2/1994 | Aguayo et al. | 29/720 X |
| 5,317,802 | 6/1994 | Jyoko | 29/740 X |
| 5,400,497 | 3/1995 | Watanabe et al. | 29/833 X |

FOREIGN PATENT DOCUMENTS 2-202100  8/1990  Japan .
3-149145  6/1991  Japan .

OTHER PUBLICATIONS

Zevatech Article, "PPM Programmable Feeder Description", Anita Grant Feb. 1990.
"Smart Feeders Prevent Placement Errors", Robert J. Black Jr., Andreas Dill, Toni Breitschmid, Circuits Manufacturing, Jan. 1990.

Primary Examiner—Peter Vo
Attorney, Agent, or Firm—Dale B. Halling; Donald C. Kordich

[57] ABSTRACT

An assembly machine (10) has a plurality of slots (22) each of which hold a feeder (24) containing a component reel (30). The assembly machine (10) automatically assembles a printed circuit board from these components. When a changeover occurs the assembly machine (10) determines which components need to be added (104), which need to be removed and which can be moved (106). The assembly machine (10) then instructs an operator to first perform all the remove operations, then to perform all the move operations and last to perform all the add operations. A combination of scanning a component ID (32) and a feeder ID (32) verifies the correct component is placed on the appropriate reel (30). The location of reel (30) among the slots (22) is verified by a proximity sensor (28).

5 Claims, 3 Drawing Sheets

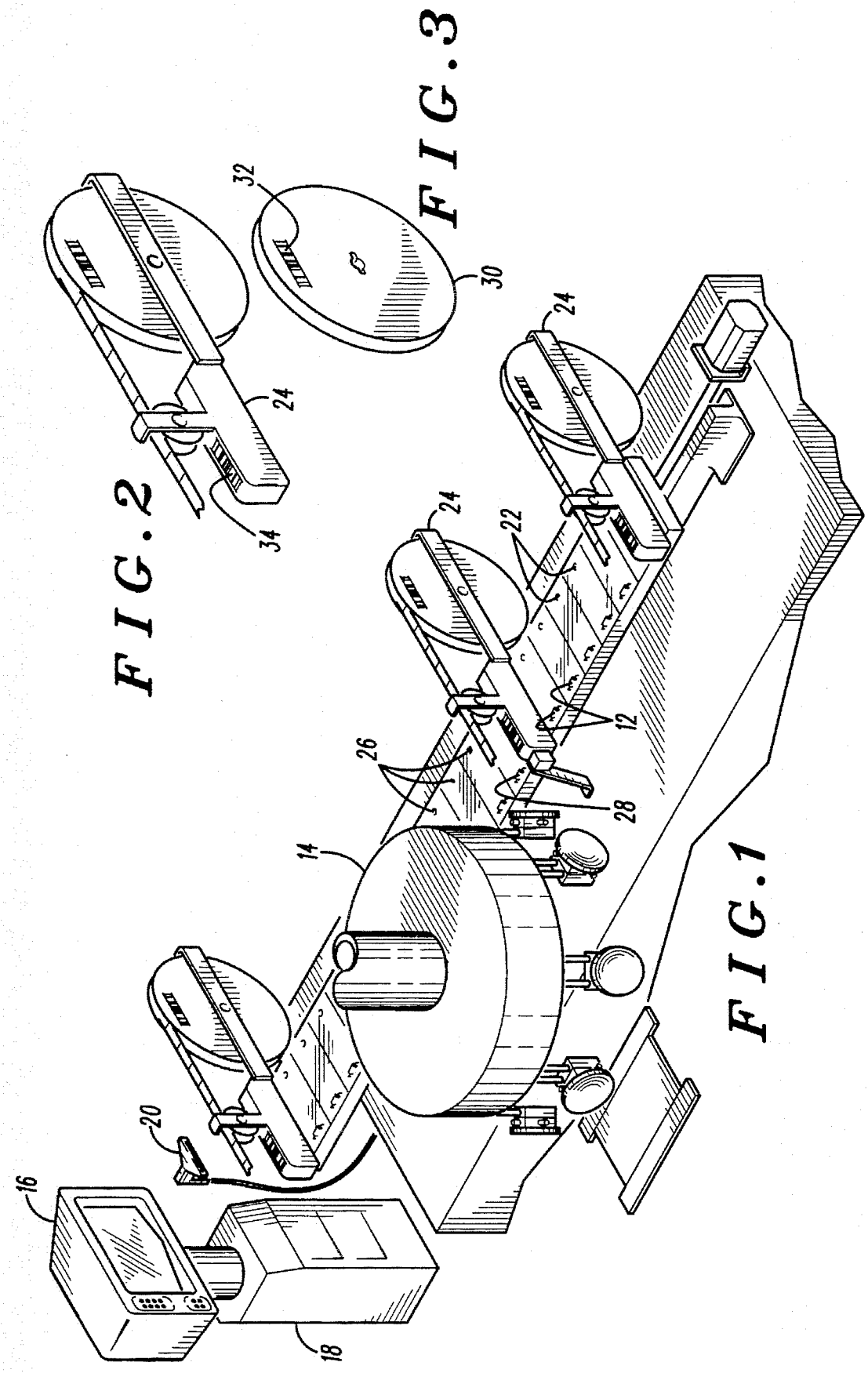

METHOD OF AND APPARATUS FOR CHANGING A PRODUCTION SETUP

FIELD OF THE INVENTION

The present invention generally relates to the field of automatic assembly machines, and more particularly, relates to a method for changing a production setup.

BACKGROUND OF THE INVENTION

In the electronics industry, assembly machines or pick-and-place machines are used to produce printed circuit boards (PCB). The pick-and-place machines use a variety of components to build a PCB. The machine's head selectively picks components, held in feeders, from predetermined locations on an assembly table and places them on a printed circuit board. When the printed circuit board is completely populated the assembly machine populates the next board. These machines save a great deal of time and labor in populating PCBs. However, because of their large cost, they usually require a large production run in order to justify their expense. Just-in-time, manufacturing has reduced production run lengths. These shorter production runs result in the operator having to change from one product's setup to a second product's setup more frequently. This can result in errors and down time.

Verification systems for pick-and-place machines have been developed to increase the operator's accuracy in setting up the machines. These systems include using bar-codes on the component reels and reading these bar codes before placing the components onto the production table. They also use lights to direct the operator where to place the feeder onto the production table. In order to ensure the operator's accuracy in placing the feeders onto the assembly table, these systems require that the operator first remove all the existing feeders, then scan the feeders before placing them back on the table. Some of the components used in producing the first product may be the same components used in the second product. The process of taking all the component feeders off the table and the placing them back on the table wastes operator time and increases machine downtime. Other systems instruct the operator, with respect to each slot on the table, to remove, remove and add or just add a component. This process still does not use all the information available to the assembly machine. The assembly of the first product may use a component in one slot, and may use that same component in the second product but in a second slot. This information is not taken advantage of by either of the described systems.

Thus, there exists a need for a process which takes advantage of the full information available to the assembly machine to minimize the number of operator steps to change the setup from a first to a second product, or from no product to a first product.

BRIEF DESCRIPTION OF THE DRAWINGS

FIG. 1 is a perspective drawing of a pick-and-place assembly machine;

FIG. 2 is a component feeder;

FIG. 3 is a component reel;

DETAILED DESCRIPTION OF THE DRAWINGS

Figure 4:
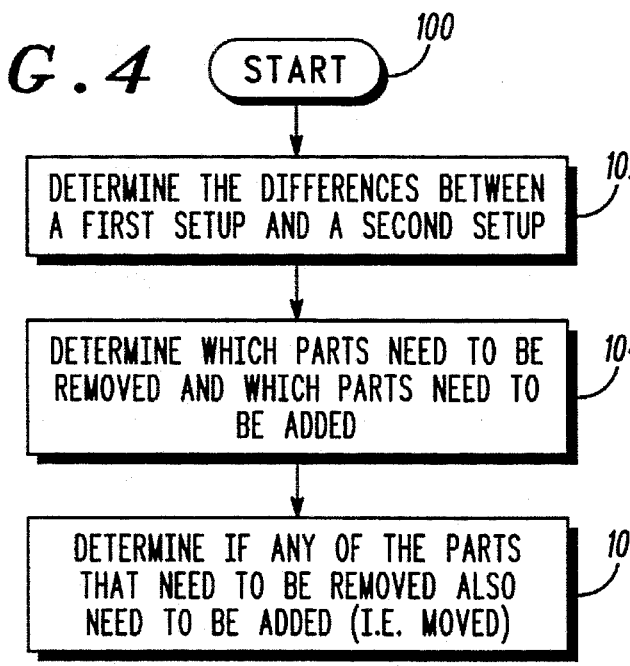
FIG. 4 is a flow chart of a method used by the assembly machine of FIG. 1 in a changeover process.

FIG. 1 shows an assembly machine, or pick-and-place machine 10. The assembly machine 10 has an assembly table 12, a pick-and-place head 14, a CRT 16, a controller 18 and a scanner 20. The assembly table 12 has a plurality of slots 22 which hold a plurality of feeders 24 (shown in FIG. 2). Each slot 22 has a LED 26 and a proximity sensor 28 which can be a variety of devices, and in the preferred embodiment is a hall effect sensor. The proximity sensors 28 sense when the feeder 24 is placed in one of the slots 22. The pick-and-place head 14 retrieves components from the feeders 24 located in the slots 22 and populates a printed circuit board (PCB). The location of the components is critical, since the assembly machine 10 populates the PCB based upon a component being located in a particular slot 22. Misplacing the feeder 24 can result in a component being misplaced which may cause the PCB to malfunction. The CRT 16 is used to give instructions and information to the operator. The controller 18 controls all aspects related to the assembly machine 10.

The scanner 20 is used to verify the type of components on a component reel 30 (shown in FIG. 3). The scanner 20 scans a component ID tag 32 on the reel 30. This information is then passed to the controller 18 which verifies the information. The operator is then instructed to place the component reel 30 onto the feeder 24, and the operator is then asked to scan the feeder ID tag 34. With this information, the controller 18 can verify the component and track the performance of the feeder 24.

When production switches from a first printed circuit board to a second printed circuit board, the first step that the controller 18 performs is shown in FIG. 4. This process starts at block 100, then it determines the differences between the first product setup and the second product setup at block 102. Next, it determines which parts from the first setup need to be removed, and which parts from the second setup need to be added at block 104. At block 106, the controller determines if any of the parts that needed to be removed from the first setup also needed to be added in the second setup. These latter parts, or components, are designated to be moved from their present slot to their destination slot.

Figure 5:
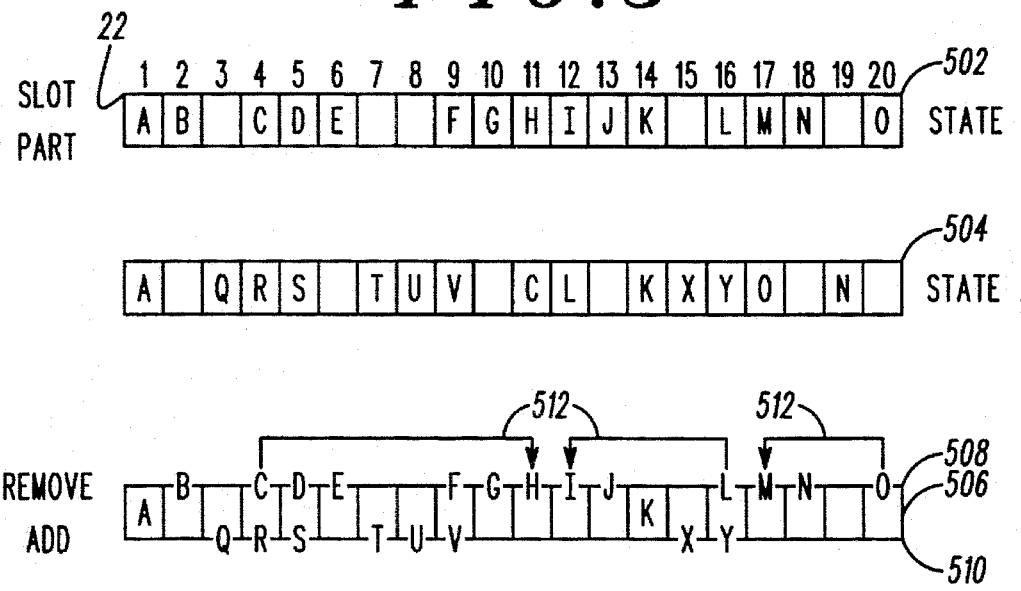
FIG. 5 is a schematic diagram of the changeover process.

The process of FIG. 4 is shown graphically in FIG. 5. The slots 22 are numbered one through twenty. Note that an actual machine would probably have considerably more than 20 slots. Each part or component is given an alpha label and not every slot has a component or a part. The top diagram 502 represents the setup of the assembly table for a first product. The second diagram 504 represents the setup necessary to produce a second product, and the third diagram 506 graphically represents the changeover process. In 506, those parts that need to be removed are shown overlapping the top line 508, those parts that need to be added are shown straddling the bottom line 510. While, those parts that need to be moved from one slot to another slot are shown by the lines and arrows 512. The first step in changing from the setup in 502 to the setup in 504 will be to remove all those components shown straddling the top line 508, and not associated with the lines 512. The next step would be to move those parts that are shown associated with the lines 512. For instance, part C will be moved from slot 4 to slot 11. Finally, the last step in the process would be to add those products straddling line 510. For instance, part Q will be added to slot 3.

Figure 6:
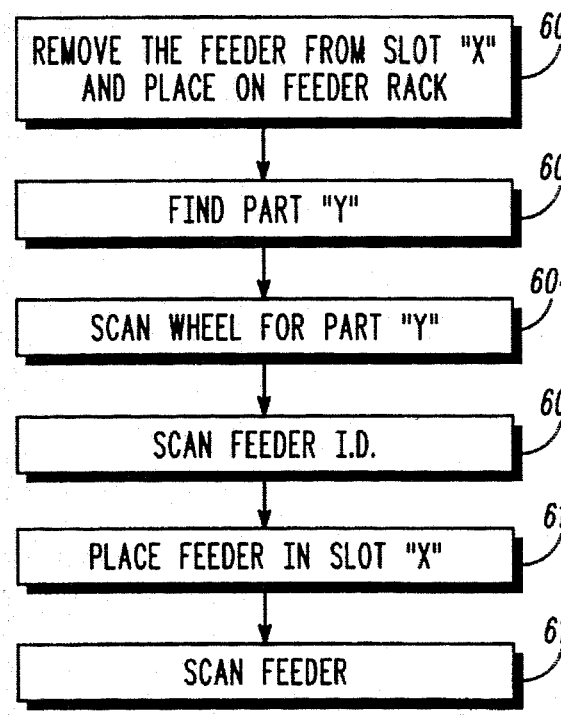
FIG. 6 is a flow chart of a remove and add operation.

FIG. 6 describes a combined remove and add step, which is represented by what occurs at slot 5 of FIG. 5. The component D is first removed and then component S is added. The first step 600 requires that a feeder be removed from a slot and that the feeder then be placed on a storage rack. The second step 602 requires the operator to find the part reel. In block 604, the operator scans the reel to verify that it is the correct part. Next, the operator in block 608 scans the feeder ID tag and mounts the part reel onto the feeder. In block 610 the operator places the feeder in the slot directed by the assembly machine. This direction is usually conveyed by both the CRT and by lighting one of the LEDs 22 where the feeder is to be placed. Step 620 requires the operator to scan the feeder after it has been placed on the assembly table 12. By asking the operator to scan the feeder both before he places the feeder onto the table and after he places the feeder on the table, the assembly machine can ensure that the operator placed the correct feeder in the correct slot. The location of the feeder is sensed by the proximity sensor 28.

Figure 7:
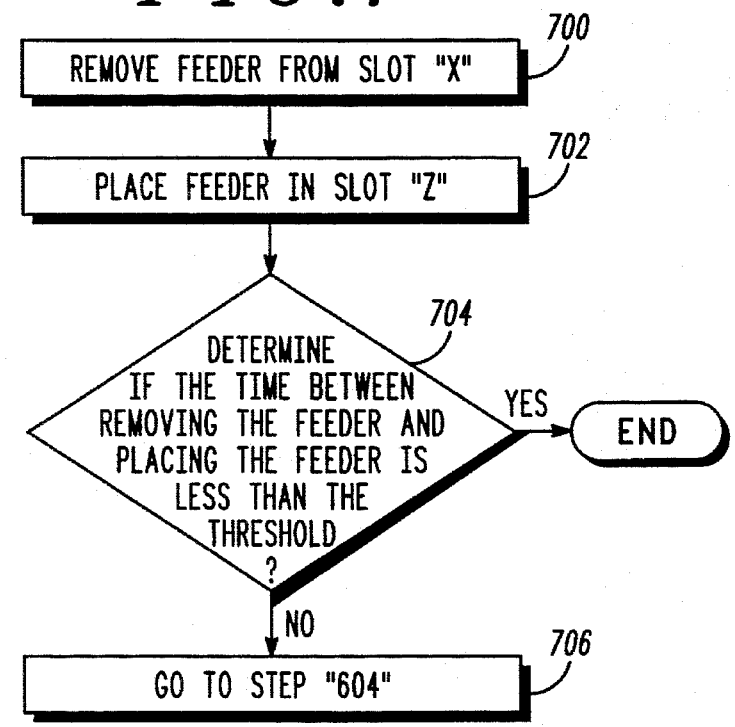
FIG. 7 is a flow chart of a move operation.

FIG. 7 describes a move operation. The operator is first told to remove a feeder, at block 700, from a particular slot. Once the controller senses that this has been done, via the proximity sensor 28, the operator is then told to place that feeder in a second slot, in block 702, which is again sensed by the proximity sensor 28. The controller then determines the time between removing the feeder and placing the feeder in the second slot. If the time is less than a threshold time, then the process continues by either going on to the next move step or starting the add steps. If the time exceeds a certain threshold, then the operator is directed to scan the part on the reel, and things continue from block 604 through 612.

The process described herein, saves time during changeovers, because the operator does not have to unload all the feeders, find new parts, scan them and load them into the slots. Further time is saved by move steps, where a part used in both setups is moved from one slot to the next slot. Having move steps saves the operator from having to remove a feeder, locate the appropriate part reel, scan the part reel, mate the reel to the feeder, and scan the feeder ID tag. Using the method described herein, production changeover time is decreased, making it economical to produce the short production runs required by just in time manufacturing.

What is claimed is:

1. A method of loading a plurality of parts required for assembling a second product by an assembly machine, the assembly machine including an assembly table having a plurality of locations for receiving the plurality of parts, a first production setup specifying pads and their locations for assembling a first product, a second production setup specifying parts and their locations for assembling a second product, the assembly table being pre-loaded with the specified parts at their locations according to the first production setup, the method comprising the steps of:

determining locations where parts specified by the first production setup differ from parts specified by the second production setup;

determining, as remove parts, parts pre-loaded at the determined locations;

determining, as add parts, parts specified by the second production setup that are specified for the determined locations;

determining, as move parts, the remove parts that are common to the add parts;

removing the remove parts, excluding the move parts, from the assembly table;

moving the move parts from their pre-loaded locations to the locations specified by the second production setup; and adding the add parts to the locations specified by the second production setup.

2. The method of claim 1, each part being contained by a reel of a plurality of reels, each reel having a part identification tag attached thereto that identifies the part contained by the reel, each reel capable of being held by a feeder of a plurality of feeders, each feeder having a feeder identification tag attached thereto that identifies the feeder, each location having a slot for placing the feeder into, the step of adding the add parts including, for each one of the add parts added, the sub-steps of:

finding the reel containing the add part;

scanning the found reel's part identification tag;

finding the feeder;

scanning the found feeder's feeder identification tag;

mounting the scanned reel onto the scanned feeder;

placing the mounted feeder into the slot at the location specified by the second production setup for the add part; and re-scanning the placed feeder's feeder identification tag.

3. The method of claim 1, each part being contained by a reel of a plurality of reels, each reel having a part identification tag attached thereto that identifies the part contained by the reel, each reel capable of being held by a feeder of a plurality of feeders, each feeder having a feeder identification tag attached thereto that identifies the feeder, each location having a slot for placing the feeder into, the step of moving the move parts including, for each one of the move parts moved, the sub-steps of:

removing the feeder holding the reel containing the move part from its pre-loaded location;

placing the removed feeder into the slot at the location specified by the second production setup;

determining the time duration from removing the feeder to placing the removed feeder; and when the determined time duration exceeds a predetermined threshold,
scanning the reel's pad identification tag, and
scanning the placed feeder's feeder identification tag.

4. An assembly machine for placing a plurality of parts on a product, each pad being contained by a reel of a plurality of reels, a plurality of feeders for holding the plurality of reels, each reel capable of being held by a feeder, each feeder having a feeder identification tag attached thereto that identifies the feeder, a first production setup specifying parts and their locations of a plurality of locations for assembling a first product, a second production setup specifying parts and their locations of the plurality of locations for assembling a second product, the assembly machine comprising:

an assembly table having a plurality of slots, one slot corresponding to each location, each feeder capable of being held in each slot;

a controller for determining locations where parts specified by the first production setup differ from parts specified by the second production setup, for determining as remove parts any parts specified by the first production setup that are specified for the determined locations, for determining as add parts any parts specified by the second production setup that are specified for the determined locations, and for determining as move parts any remove parts that are common to the add parts; and a display, coupled with the controller, for instructing an operator to remove the remove parts excluding the move parts from the assembly table, for moving the move parts from the locations specified by the first production setup to the locations specified by the second production setup, and for adding the add parts to the locations specified by the second production setup.

5. The assembly machine of claim 4, each reel having a part identification tag attached thereto that identifies the part contained by the reel, each feeder having a feeder identification tag attached thereto that identifies the feeder, the assembly machine further comprising:

a plurality of sensors coupled with the controller, one sensor for each slot for sensing removal of any feeder from one slot and addition of any feeder into one slot; and a scanner, coupled with the controller, for scanning any reel's part identification tag and any feeder's feeder identification tag;

the controller further for determining the time duration from removal of the feeder from one location to addition of the removed feeder to another location, and, when the determined time duration exceeds a predetermined threshold, for instructing the operator to scan the part identification tag of the reel containing the added feeder and the added feeder's feeder identification tag.

\* \* \* \* \*

UNITED STATES PATENT AND TRADEMARK OFFICE
CERTIFICATE OF CORRECTION

PATENT NO. : 5,553,376
DATED : September 10, 1996
INVENTOR(S) : Solanki et al.

It is certified that error appears in the above-indentified patent and that said Letters Patent is hereby corrected as shown below:

Title Page

Item [57] Abstract
In line 11, replace "feeder ID (32)" with --feeder ID (34)--.

Claim 1

In column 3, line 51, please replace "pads" with --parts--.

Claim 3

In column 4, line 45, please replace "pad" with --part--.

Claim 4

In column 4, line 48, please replace "pad" with --part--.

Signed and Sealed this

Fifteenth Day of April, 1997

*Attest:*

BRUCE LEHMAN

*Attesting Officer*   Commissioner of Patents and Trademarks